(12) United States Patent
Miao et al.

(10) Patent No.: US 9,473,137 B2
(45) Date of Patent: Oct. 18, 2016

(54) NON-VOLATILE BOOLEAN LOGIC OPERATION CIRCUIT AND OPERATION METHOD THEREOF

(71) Applicant: Huazhong University of Science and Technology, Wuhan (CN)

(72) Inventors: Xiangshui Miao, Wuhan (CN); Yaxiong Zhou, Wuhan (CN); Yi Li, Wuhan (CN); Huajun Sun, Wuhan (CN)

(73) Assignee: HUAZHONG UNIVERSITY OF SCIENCE AND TECHNOLOGY, Wuhan (CN)

(*) Notice: Subject to any disclaimer, the term of this patent is extended or adjusted under 35 U.S.C. 154(b) by 0 days.

(21) Appl. No.: 14/867,030

(22) Filed: Sep. 28, 2015

(65) Prior Publication Data

US 2016/0020766 A1    Jan. 21, 2016

Related U.S. Application Data

(63) Continuation-in-part of application No. PCT/CN2014/081870, filed on Jul. 9, 2014.

(30) Foreign Application Priority Data

Jun. 20, 2014 (CN) .......................... 2014 1 0279445

(51) Int. Cl.
*H03K 19/00* (2006.01)
*H03K 19/20* (2006.01)
*H03K 19/08* (2006.01)

(52) U.S. Cl.
CPC ...... *H03K 19/0002* (2013.01); *H03K 19/0021* (2013.01); *H03K 19/0813* (2013.01); *H03K 19/20* (2013.01)

(58) Field of Classification Search
CPC .......................... H03K 19/0002; H03K 19/03
See application file for complete search history.

(56) References Cited

U.S. PATENT DOCUMENTS

| | | | | |
|---|---|---|---|---|
| 2011/0121359 A1* | 5/2011 | Yang | ..................... | H01L 29/861 257/109 |
| 2012/0113706 A1* | 5/2012 | Williams | ........... | G11C 13/0007 365/148 |
| 2013/0343114 A1* | 12/2013 | Carter | ................ | G11C 13/0007 365/148 |
| 2014/0192587 A1* | 7/2014 | Nugent | .............. | G11C 13/0033 365/148 |
| 2014/0268994 A1* | 9/2014 | Rose | .................. | G11C 13/0059 365/148 |
| 2015/0170025 A1* | 6/2015 | Wu | ...................... | G06N 3/0635 706/25 |
| 2015/0256178 A1* | 9/2015 | Kvatinsky | ........ | H03K 19/00346 326/31 |

* cited by examiner

*Primary Examiner* — Jason M Crawford
*Assistant Examiner* — Kurtis R Bahr
(74) *Attorney, Agent, or Firm* — Matthias Scholl, PC; Matthias Scholl

(57) ABSTRACT

A non-volatile Boolean logic operation circuit, including: two input ends; an output end; a first resistive switching element $M_1$, the first resistive switching element M including a positive electrode and a negative electrode; and a second resistive switching element $M_2$, the second resistive switching element $M_2$ including a positive electrode and a negative electrode. The negative electrode of the first resistive switching element $M_1$ operates as a first input end of the logic operation circuit. The negative electrode of the second resistive switching element $M_2$ operates as a second input end of the logic operation circuit. The positive electrode of the second resistive switching element $M_2$ is connected to the positive electrode of the first resistive switching element $M_1$, and a connected end thereof operates as the output end of the logic operation circuit.

20 Claims, 5 Drawing Sheets

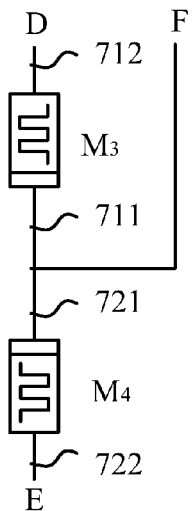

FIG. 7

| Controlling an initial state of each of a third variable resistance element and a fourth variable resistance element by inputting a high-level signal or a low-level signal to the third input end, and inputting a signal having an opposite level thereto to the fourth input end | S801 |
| --- | --- |
| hanging storage states of the third variable resistance element and the fourth variable resistance element by inputting a signal D to the third input end, and a signal E to the fourth input end | S802 |
| onducting read operation of an output end by inputting a read voltage to the third input end or the fourth input end | S803 |
| Obtaining an operation result of the non-volatile Boolean logic operation circuit according to D, E, R and W | S804 |

FIG. 8

NON-VOLATILE BOOLEAN LOGIC OPERATION CIRCUIT AND OPERATION METHOD THEREOF

CROSS-REFERENCE TO RELATED APPLICATIONS

This application is a continuation-in-part of International Patent Application No. PCT/CN2014/081870 with an international filing date of Jul. 9, 2014, designating the United States, now pending, and further claims priority benefits to Chinese Patent Application No. 201410279445.8 filed Jun. 20, 2014. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

1. Field of the Invention

The invention relates to a non-volatile Boolean logic operation circuit and an operation method thereof.

2. Description of the Related Art

Typically, a logic gate circuit adopts a memristor, a unidirectional conduction element, and a resistor to facilitate logics 'AND' and 'OR'. However, the circuit cannot completely realize all sixteen types of Boolean logics, and storage states of the memristor employ a current readout circuit, which makes it impossible to concatenate digital logics.

SUMMARY OF THE INVENTION

In view of the above-described problems, it is one objective of the invention to provide a non-volatile Boolean logic operation circuit and an operation thereof that are capable of facilitating 16 types of Boolean logic operation in a circuit, as well as combination of calculation with storage by directly storing operation results in impedance states of the circuit in a non-volatile manner.

To achieve the above objective, according to one embodiment of the invention, there is provided a non-volatile Boolean logic operation circuit. The logic operation circuit comprises: two input ends; an output end; a first resistive switching element $M_1$, the first resistive switching element $M_1$ comprising a positive electrode and a negative electrode; and a second resistive switching element $M_2$, the second resistive switching element $M_2$ comprising a positive electrode and a negative electrode. The negative electrode of the first resistive switching element $M_1$ operates as a first input end of the logic operation circuit, the negative electrode of the second resistive switching element $M_2$ operates as a second input end of the logic operation circuit, and the positive electrode of the second resistive switching element $M_2$ is connected to the positive electrode of the first resistive switching element $M_1$, and a connected end thereof operates as the output end of the logic operation circuit. The two input ends of the logic operation circuit operate to input signals, and the output end thereof operates to output signals. A positive electrode and a negative electrode of the resistive switching element enable the resistive switching element to change from a high resistance state into a low resistance state as forward bias that is high enough is applied to the positive electrode, and to change from the low resistance state into the high resistance state as forward bias that is high enough is applied to the negative electrode.

An impedance state of the first resistive switching element $M_1$ changes with a voltage between the positive electrode and the negative electrode thereof.

An impedance state of the second resistive switching element $M_2$ changes with a voltage between the positive electrode and the negative electrode thereof.

In a class of this embodiment, the resistive switching element is a memristor, the positive electrode of the resistive switching element is a first end thereof, and the negative electrode of the resistive switching element is a second end thereof.

The positive electrode enables the resistive switching element to change from the high resistance state into the low resistance state as forward bias greater than a threshold voltage is applied to the positive electrode, and the negative electrode enables the resistive switching element to change from the low resistance state into the high resistance state as forward bias less than the threshold voltage is applied to the negative electrode.

According to another embodiment of the invention, there is provided an operation method of a non-volatile Boolean logic operation circuit. The method comprises:

1) controlling an initial state of each of a first resistive switching element and a second resistive switching element by inputting a high-level signal or a low-level signal to the first input end, and inputting a signal having an opposite level thereto to the second input end;

an initial state of the first resistive switching element being written as a high resistance state as a signal input to the first input end is high level and a signal input to the second input end is low level, and an initial state of the second resistive switching element being written as a low resistance state, and this type of writing being labeled as forward writing W=1;

the initial state of the first resistive switching element being written as a low resistance state as the signal input to the first input end is low level and the signal input to the second input end is high level, and the initial state of the second resistive switching element being written as a high resistance state, and this type of writing being labeled as reverse writing $\overline{W}$=1; and the high resistance state of each of the resistive switching elements operating to store a logic 0, and the low resistance state of the resistive switching element operating to store a logic 1;

2) changing storage states of the first resistive switching element and the second resistive switching element by inputting a signal A to the first input end, and a signal B to the second input end;

the storage state of the first resistive switching element being changed from the initial state to the low resistance state, and the storage state of the second resistive switching element being changed from the initial state to the high resistance state as the signal A is low level and the signal B is high level;

the storage state of the first resistive switching element being changed from the initial state to the high resistance state, and the storage state of the second resistive switching element being changed from the initial state to the low resistance state as the signal A is high level and the signal B is low level; and the first resistive switching element and the second resistive switching element being maintained in the initial state as both the signal A and the signal B are high level or low level;

3) conducting read operation of an output end by inputting a read voltage to the first input end or the second input end;

the storage state of the first resistive switching element being obtained by reading a current of the first resistive switching element at the output end as the read voltage is input to the first input end and the second input end is suspended, and this type of reading being labeled as R=1;

the storage state of the second resistive switching element being obtained by reading a current of the second resistive switching element at the output end as the first input end is suspended and the read voltage is input to the second input end, and this type of reading being labeled as $\overline{R}=1$; and an amplitude of the read voltage being less than that of a voltage of each of the resistive switching elements as resistive switching occurs, namely a threshold voltage thereof; and 4) obtaining an operation result of the non-volatile Boolean logic operation circuit according to A, B, R and W: $L=A\cdot\overline{B}\cdot W\cdot\overline{R}+(\overline{A}+B)\cdot\overline{W}\cdot R+\overline{A}\cdot B\cdot W\cdot R+(A+\overline{B})\cdot W\cdot\overline{R}$; where A represents a signal input to the first input end, B represents a signal input to the second input end, W represents a write direction of initialization, and R represents a readout direction of the operation result.

In a class of this embodiment, sixteen types of Boolean logic operation are facilitated by adjusting values of A, B, W and R as follows:

facilitating logic 0: W=0, A=0, B=0, and R=0;

namely setting: reverse writing, a signal A input to the first input end of 0, a signal B input to the second input end of 0, and reverse readout;

facilitating logic 1: W=0, A=1, B=0, and R=0;

namely setting: reverse writing, a signal A input to the first input end of 1, a signal B input to the second input end of 0, and reverse readout;

facilitating logic operation of P: W=0, A=P, B=0, and R=0;

namely setting: reverse writing, a signal A input to the first input end of P, a signal B input to the second input end of 0, and reverse readout;

facilitating logic operation of Q: W=1, A=0, B=Q, and R=1;

namely setting: forward writing, a signal A input to the first input end of 0, a signal B input to the second input end of Q, and forward readout;

facilitating logic operation of $\overline{P}$: W=1, A=P, B=1, and R=1;

namely setting: forward writing, a signal A input to the first input end of P, a signal B input to the second input end of 1, and forward readout;

facilitating logic operation of $\overline{Q}$: A=1, B=Q, W=0, and R=0;

namely setting: reverse writing, a signal A input to the first input end of 1, a signal B input to the second input end of Q, and reverse readout;

facilitating logic operation of $P+\overline{Q}$: A=P, B=Q, W=1, and R=0;

namely setting: forward writing, a signal A input to the first input end of P, a signal B input to the second input end of Q, and reverse readout;

facilitating logic operation of $\overline{P}+Q$: A=P, B=Q, W=0, and R=1;

namely setting: reverse writing, a signal A input to the first input end of P, a signal B input to the second input end of Q, and forward readout;

facilitating logic operation of $\overline{P}\cdot Q$: A=P, B=Q, W=1, and R=1;

namely setting: forward writing, a signal A input to the first input end of P, a signal B input to the second input end of Q, and forward readout;

facilitating logic operation of $P\cdot\overline{Q}$: A=P, B=Q, W=0, and R=0;

namely setting: reverse writing, a signal A input to the first input end of P, a signal B input to the second input end of Q, and reverse readout;

facilitating logic operation of $P\cdot Q$: A=Q, B=P, W=0, and R=Q;

namely setting: reverse writing, a signal A input to the first input end of Q, a signal B input to the second input end of P, and readout direction of Q;

facilitating logic operation of $\overline{P\cdot Q}$: A=Q, B=P, W=1, and R=Q;

namely setting: forward writing, a signal A input to the first input end of Q, a signal B input to the second input end of P, and readout direction of Q;

facilitating logic operation of P+Q: A=Q, B=P, W=0, and R=P;

namely setting: reverse writing, a signal A input to the first input end of Q, a signal B input to the second input end of P, and readout direction of P;

facilitating logic operation of $\overline{P+Q}$: A=Q, B=P, W=1, and R=P;

namely setting: forward writing, a signal A input to the first input end of Q, a signal B input to the second input end of P, and readout direction of P;

facilitating logic operation of $\overline{P}\cdot Q+P\cdot\overline{Q}$: A=P, B=0, W=0, and R=Q;

namely setting: reverse writing, a signal A input to the first input end of P, a signal B input to the second input end of 0, and readout direction of Q;

facilitating logic operation of $P\cdot Q+\overline{P}\cdot\overline{Q}$: A=0, B=P, W=1, and R=Q;

namely setting: forward writing, a signal A input to the first input end of P, a signal B input to the second input end of 0, and readout direction of Q.

According to a further embodiment of the invention, there is provided a non-volatile Boolean logic operation circuit. The logic operation circuit comprises: two input ends; an output end; a third resistive switching element $M_3$, the third resistive switching element $M_3$ comprising a positive electrode and a negative electrode; and a fourth resistive switching element $M_4$, the fourth resistive switching element $M_4$ comprising a positive electrode and a negative electrode. The positive electrode of the third resistive switching element $M_3$ operates as a first input end of the logic operation circuit. The positive electrode of the fourth resistive switching element $M_4$ operates as a second input end of the logic operation circuit. The negative electrode of the fourth resistive switching element $M_4$ is connected to the negative electrode of the third resistive switching element $M_3$, and a connected end thereof operates as the output end of the logic operation circuit. The two input ends of the logic operation circuit operate to input signals, and the output end thereof operates to output signals.

A positive electrode and a negative electrode of the resistive switching element enable the resistive switching element to change from a high resistance state into a low resistance state as forward bias that is high enough is applied to the positive electrode, and to change from the low resistance state into the high resistance state as forward bias that is high enough is applied to the negative electrode.

An impedance state of the third resistive switching element $M_3$ changes with a voltage between the positive electrode and the negative electrode thereof.

An impedance state of the fourth resistive switching element $M_4$ changes with a voltage between the positive electrode and the negative electrode thereof.

In a class of this embodiment, the resistive switching element is a memristor, the positive electrode of the resistive switching element is a first end thereof, and the negative electrode of the resistive switching element is a second end thereof.

The positive electrode enables the resistive switching element to change from the high resistance state into the low resistance state as forward bias greater than a threshold voltage is applied to the positive electrode, and the negative electrode enables the resistive switching element to change from the low resistance state into the high resistance state as forward bias less than the threshold voltage is applied to the negative electrode.

According to still another embodiment of the invention, there is provided an operation method of a non-volatile Boolean logic operation circuit. The method comprises:

1) controlling an initial state of each of a third resistive switching element and a fourth resistive switching element by inputting a high-level signal or a low-level signal to the third input end, and inputting a signal having an opposite level thereto to the fourth input end;

an initial state of the third resistive switching element being written as a low resistance state as a signal input to the first input end is high level and a signal input to the fourth input end is low level, and an initial state of the fourth resistive switching element being written as a high resistance state, and this type of writing being labeled as forward writing W=1;

the initial state of the third resistive switching element being written as a high resistance state as the signal input to the third input end is low level and the signal input to the fourth input end is high level, and the initial state of the fourth resistive switching element being written as a low resistance state, and this type of writing being labeled as reverse writing $\overline{W}=1$; and the high resistance state of each of the resistive switching elements operating to store a logic 0, and the low resistance state of the resistive switching element operating to store a logic 1;

2) changing storage states of the third resistive switching element and the fourth resistive switching element by inputting a signal D to the third input end, and a signal E to the fourth input end;

the storage state of the third resistive switching element being changed from the initial state to the high resistance state, and the storage state of the fourth resistive switching element being changed from the initial state to the low resistance state as the signal D is low level and the signal E is high level;

the storage state of the third resistive switching element being changed from the initial state to the low resistance state, and the storage state of the fourth resistive switching element being changed from the initial state to the high resistance state as the signal D is high level and the signal E is low level; and the third resistive switching element and the fourth resistive switching element being maintained in the initial state as both the signal D and the signal E are high level or low level;

3) conducting read operation of an output end by inputting a read voltage to the third input end or the fourth input end;

the storage state of the third resistive switching element being obtained by reading a current of the third resistive switching element at the output end as the read voltage is input to the third input end and the fourth input end is suspended, and this type of reading being labeled as R=1; and the storage state of the fourth resistive switching element being obtained by reading a current of the fourth resistive switching element at the output end as the third input end is suspended and the read voltage is input to the fourth input end, and this type of reading being labeled as $\overline{R}=1$;

an amplitude of the read voltage being less than that of a voltage of each of the resistive switching elements as resistive switching occurs, namely a threshold voltage thereof; and 4) obtaining an operation result of the non-volatile Boolean logic operation circuit according to D, E, R and W: $L = D \cdot \overline{E} \cdot W \cdot R + (\overline{D}+E) \cdot \overline{W} \cdot \overline{R} + \overline{D} \cdot E \cdot W \cdot \overline{R} + (D+E) \cdot W \cdot R$; where D represents a signal input to the third input end, E represents a signal input to the fourth input end, W represents a write direction of initialization, and R represents a readout direction of the operation result.

In a class of this embodiment, sixteen types of Boolean logic operation are facilitated by adjusting values of D, E, W and R as follows:

facilitating logic 0: D=0, E=0, W=0, and R=1;
namely setting: reverse writing, a signal D input to the third input end of 0, a signal E input to the fourth input end of 0, and forward readout;

facilitating logic 1: D=1, E=0, W=0, and R=1;
namely setting: reverse writing, a signal D input to the third input end of 1, a signal E input to the fourth input end of 0, and forward readout;

facilitating logic operation of P: D=P, E=0, W=0, and R=1;
namely setting: reverse writing, a signal D input to the third input end of P, a signal E input to the fourth input end of 0, and forward readout;

facilitating logic operation of Q: D=0, E=Q, W=1, and R=0;
namely setting: forward writing, a signal D input to the third input end of 0, a signal E input to the fourth input end of Q, and reverse readout;

facilitating logic operation of $\overline{P}$: D=P, E=1, W=1, and R=0;
namely setting: forward writing, a signal D input to the third input end of P, a signal E input to the fourth input end of 1, and reverse readout;

facilitating logic operation of $\overline{Q}$: D=1, E=Q, W=0, and R=1;
namely setting: reverse writing, a signal D input to the third input end of 1, a signal E input to the fourth input end of Q, and forward readout;

facilitating logic operation of $P+\overline{Q}$: D=P, E=Q, W=1, and R=1;
namely setting: forward writing, a signal D input to the third input end of P, a signal E input to the fourth input end of Q, and forward readout;

facilitating logic operation of $\overline{P}+Q$: D=P, E=Q, W=0, and R=0;
namely setting: reverse writing, a signal D input to the third input end of P, a signal E input to the fourth input end of Q, and reverse readout;

facilitating logic operation of $\overline{P} \cdot Q$: D=P, E=Q, W=1, and R=0;
namely setting: forward writing, a signal D input to the third input end of P, a signal E input to the fourth input end of Q, and reverse readout;

facilitating logic operation of $P \cdot \overline{Q}$: D=P, E=Q, W=0, and R=1;

namely setting: reverse writing, a signal D input to the third input end of P, a signal E input to the fourth input end of Q, and forward readout;

facilitating logic operation of P·Q: D=P, E=Q, W=1, R=Q;

namely setting: forward writing, a signal D input to the third input end of P, a signal E input to the fourth input end of Q, and readout direction of Q;

facilitating logic operation of $\overline{P}\cdot\overline{Q}$: D=P, E=Q, W=0, R=Q;

namely setting: reverse writing, a signal D input to the third input end of P, a signal E input to the fourth input end of Q, and readout direction of Q;

facilitating logic operation of P+Q: D=P, E=Q, W=1, R=P;

namely setting: forward writing, a signal D input to the third input end of P, a signal E input to the fourth input end of Q, and readout direction of P;

facilitating logic operation of $\overline{P}+\overline{Q}$: D=P, E=Q, W=0, R=P;

namely setting: reverse writing, a signal D input to the third input end of P, a signal E input to the fourth input end of Q, and readout direction of P;

facilitating logic operation of $\overline{P}\cdot Q+P\cdot\overline{Q}$: D=0, E=P, W=1, R=Q;

namely setting: forward writing, a signal D input to the third input end of 0, a signal E input to the fourth input end of P, and readout direction of Q;

facilitating logic operation of $P\cdot Q+\overline{P}\cdot\overline{Q}$: D=P, E=0, W=0, R=Q;

namely setting: reverse writing, a signal D input to the third input end of P, a signal E input to the fourth input end of 0, and readout direction of Q.

According to a still further embodiment of the invention, there is provided a non-volatile Boolean logic operation circuit. The logic operation circuit comprises: two input ends; an output end; a fifth resistive switching element $M_5$, the fifth resistive switching element $M_5$ comprising a positive electrode and a negative electrode; a sixth resistive switching element $M_6$, the sixth resistive switching element $M_6$ comprising a positive electrode and a negative electrode; a first resistor $R_1$; a first switching element $S_1$, the first switching element $S_1$ comprising a first end and a second end; and a first voltage converter, the first voltage converter comprising a first end and a second end. The negative electrode of the fifth resistive switching element $M_5$ operates as a first input end of The logic operation circuit. The negative electrode of the sixth resistive switching element $M_6$ operates as a second input end of the logic operation circuit. The positive electrode of the sixth resistive switching element $M_6$ is connected to the positive electrode of the fifth resistive switching element $M_5$, and further to the first end of the first switching element, and the second end of the first switching element is connected to the ground via the first resistor $R_1$. The first end of the first voltage converter is connected to the second end of the first switching element, and the second end of the first voltage converter operates as the output end of the logic operation circuit. The first input end and the second input end of the logic operation circuit operate to input signals, and the output end of the logic operation circuit operates to output signals.

In a class of this embodiment, the resistive switching element is a memristor.

In a class of this embodiment, the circuit further comprises a voltage dividing circuit being a voltage dividing resistor.

In a class of this embodiment, a voltage at an input end of the first voltage converter is $R/(R+R_m) V_r$. The first voltage converter transforms a voltage less than $R/(R+R_L) V_r$ into low level, and a voltage greater than $R/(R+R_h) V_r$ into high level, and therefore the threshold value of the first voltage converter ranges from $R/(R+RL)Vr$ to $R/(R+Rh)Vr$. If the threshold value of the first voltage converter is within the range, requirement for the voltage dividing resistor is not that strict, and there will be no limitation on a resistance thereof. R represents a resistance of the first resistor, $R_m$ represents a resistance of each of the resistive switching elements, RL represents a resistance of each of the resistive switching elements in a low resistance state, Rh represents a resistance of each of the resistive switching elements in a high resistance state, and Vr represents a magnitude of the read voltage.

In a class of this embodiment, the first switching element $S_1$ is a first voltage control switch, the first voltage converter comprises a second voltage control switch and a third voltage control switch, the first voltage control switch is a switching element that is switched on in high level and switched off in low level, the second voltage control switch is a switching element that is switched on in high level and switched off in low level, and the third voltage control switch is a switching element that is switched on in low level and switched off in high level.

In a class of this embodiment, the first voltage control switch and the second voltage control switch are N-type field effect transistors, and the third voltage control switch is a P-type field effect transistor.

Advantages according to embodiments of the invention are summarized as follows:

The logic circuit with two resistive switching elements of the invention is capable of facilitating at least sixteen types of fundamental Boolean logic operation, and results of the logic operation are directly stored in impedance states of the resistive switching elements, which realize combination of calculation with storage. Moreover, the logic circuit only needs a small number of components and features simple operation, and thus saving power consumption and time for calculation, and improving calculation efficiency.

BRIEF DESCRIPTION OF THE DRAWINGS

The invention is described hereinbelow with reference to the accompanying drawings, in which:

FIG. 7 is a schematic diagram of a non-volatile Boolean logic operation circuit of a second exemplary embodiment of the invention;

FIG. 8 is a flowchart illustrating an operation method of the non-volatile Boolean logic operation circuit of the second exemplary embodiment of the invention;

DETAILED DESCRIPTION OF THE EMBODIMENTS

For further illustrating the invention, experiments detailing a non-volatile Boolean logic operation circuit and an operation thereof are described below. It should be noted that the following examples are intended to describe and not to limit the invention.

Figure 5:
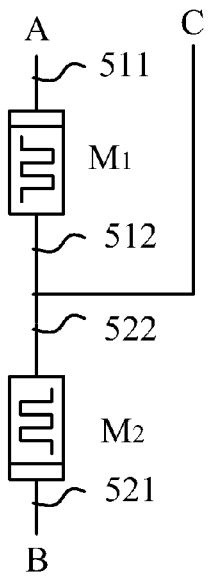
FIG. 5 is a schematic diagram of a non-volatile Boolean logic operation circuit of a first exemplary embodiment of the invention.

FIG. 5 illustrates a non-volatile Boolean logic operation circuit of a first exemplary embodiment of the invention. For the purpose of clear explanation, only parts relating to this embodiment are illustrated therein and described as follows:

The technical solutions according to embodiments described hereinafter are described in conjunction with the drawings. The described embodiments are merely some of the possible embodiments. Any other embodiment obtained by those skilled in the art based on the embodiments described should fall into the scope of protection of the present disclosure.

Terms of "first", "second", etc. (if exist), used in the specification and the drawings, are intended to distinguish similar objects, rather than to describe a specific order or precedence. It should be understood that, those terms are applied, during describing the embodiments, to distinguish the objects having same attributes, and those terms may be interchangeable under proper circumstance. In addition, terms of "comprise", "have" and any transformation thereof are intended to be non-exclusive. Further, procedures, methods, systems, products or devices including a series of units are not limited to the units expressly listed, and inherent units or the units which are not expressively listed may be included in the procedures, methods, systems, products or devices.

Figure 1:
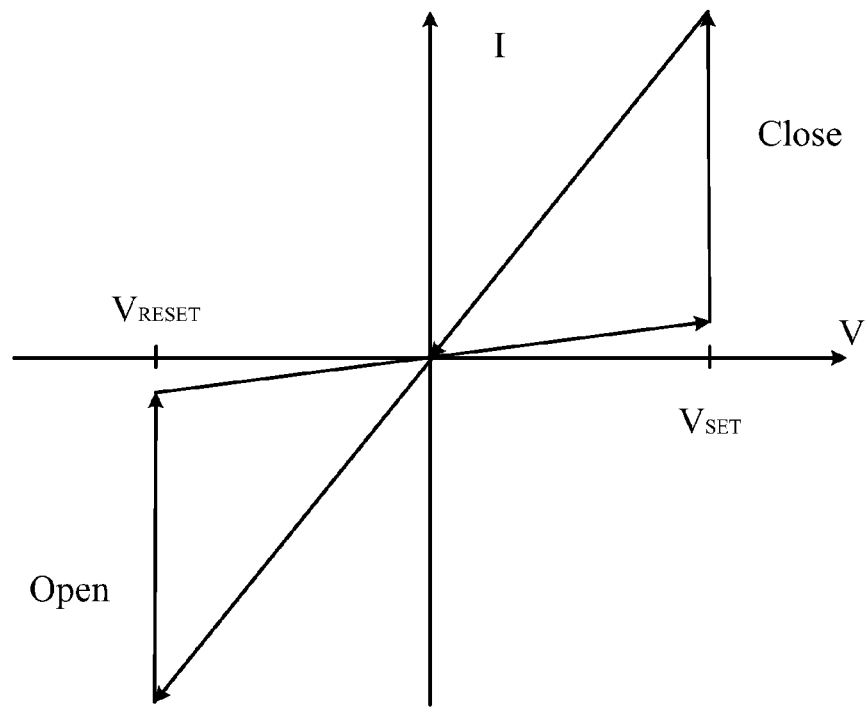
FIG. 1 is a voltage-current characteristic curve of a memristor.
Figure 2:
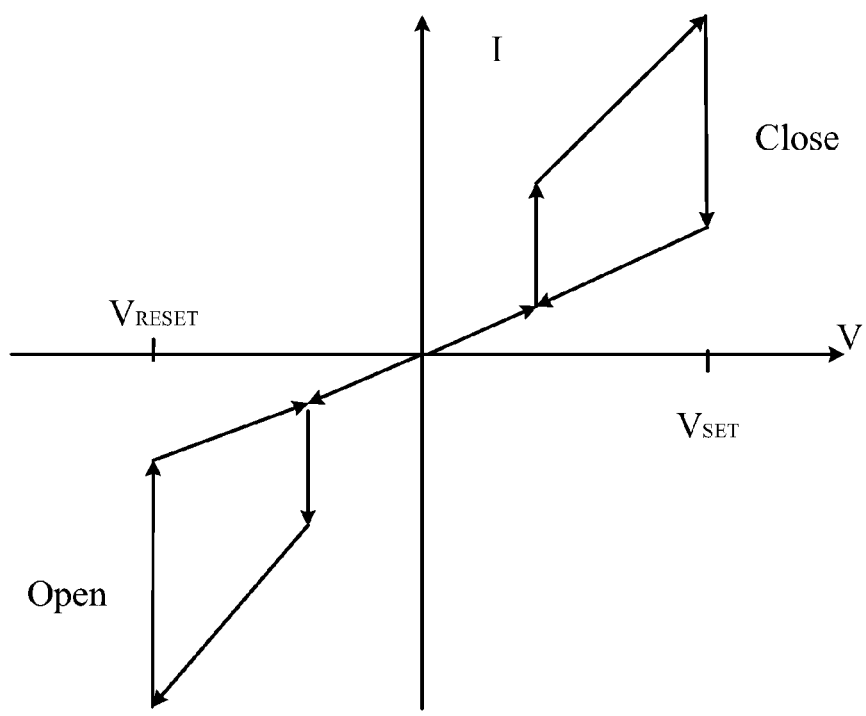
FIG. 2 is a voltage-current characteristic curve of a complementary memristor.
Figure 3:
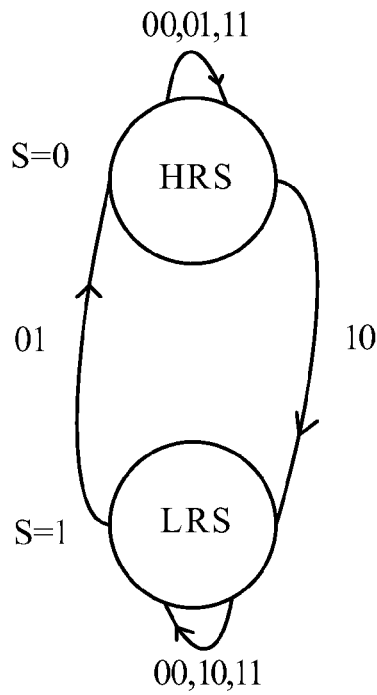
FIG. 3 illustrates state transition of a bipolar memristor.

Prior to detailed description of the invention, characteristics of the memristor are given first. FIG. 1 is a voltage-current characteristic curve of a bipolar memristor, and FIG. 2 is a voltage-current characteristic curve of a complementary memristor. As can be seen from FIG. 1, as a positive voltage applied to both ends of the memristor is greater than or equal to a first voltage threshold $V_1$, the memristor changes from a high resistance state into a low resistance state; as a negative voltage applied to both ends of the memristor is greater than or equal to a second voltage threshold $V_2$, the memristor changes from the low resistance state into the high resistance state. FIG. 3 illustrates state transition of the memristor, as the memristor is in the high resistance state, only forward bias can change the memristor from the high resistance state to the low resistance state, and neither reverse bias nor zero-voltage bias can change a state thereof; as the memristor is in the low resistance state, only reverse bias can change the memristor from the low resistance state to the high resistance state, and neither forward bias nor the zero-voltage bias can change a state thereof.

Based on the above-mentioned characteristics of the memristor, the invention controls an impedance state of the memristor by controlling a voltage applied to both ends thereof, and stores a logic 0 and a logic 1 by changing the impedance state thereof. For example, as the memristor is in a low resistance state, the memristor stores the logic 1; and as the memristor is in a high resistance state, the memristor stores the logic 0. Alternatively, the memristor can stores the logic 0 as being in the low resistance state, and the logic 1 as being in the high resistance state.

Figure 4:
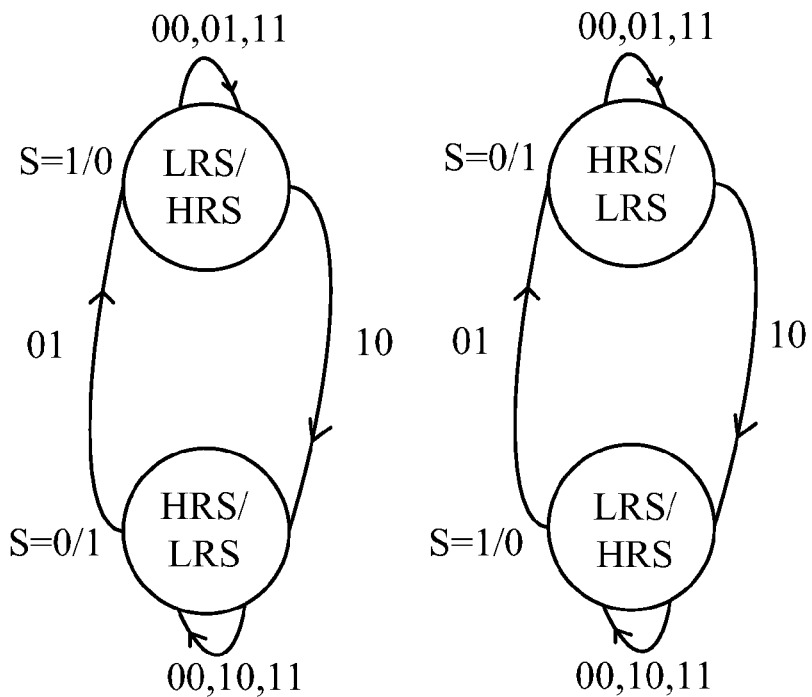
FIG. 4 illustrates state transition of two types of complementary memristors.

It should be emphasized herein that two memristors that are directly connected in this invention are referred to as complementary memristors or complementary resistive switches (CRS), and it is possible to make them into a three-end component by using a particular process, as shown in FIG. 4, as the memristor is in the high resistance state, only forward bias can change the memristor from the high resistance state to the low resistance state, and neither reverse bias nor zero-voltage bias can change a state thereof; as the memristor is in the low resistance state, only reverse bias can change the memristor from the low resistance state to the high resistance state, and neither forward bias nor the zero-voltage bias can change a FIG. 4 state thereof.

Technical solution of the invention will be explained hereinafter with respect to specific embodiments, which can be combined with each other in different manners, and it should be understood that identical or similar concepts or procedures will not be repeated in some embodiments.

FIG. 5 is a schematic diagram of a non-volatile Boolean logic operation circuit of a first exemplary embodiment of the invention. For the purpose of clear illustration and as an example, a resistive switching element is labeled as a memristor. It can be understood by those skilled in the art that the resistive switching element can be a magnetic random access memory (comprising a spin transfer torque magnetic random access memory (STT-MRAM), a magnetic tunnel junction element (MTJ), a spin valve and so on), a resistive memory, a phase change memory, or other types of resistive switching elements that are capable of reversely changing states in the high resistance state or the low resistance state. As shown in FIG. 5, the logic operation circuit of the first embodiment comprises a first resistive switching element $M_1$, and a second resistive switching element $M_2$.

A first end 511 of the first resistive switching element $M_1$ operates as a first input end of the logic operation circuit, a second end 521 of the second resistive switching element $M_2$ operates as a second input end of the logic operation circuit, a second end 522 of the second resistive switching element $M_2$ is connected to a second end 512 of the first resistive switching element $M_1$, and operates as a first output end of the logic operation circuit; the first input end and the second input end operate to input signals, and the first output end operates to output signals.

The first end of the resistive switching element is a negative electrode thereof, and the second end of resistive switching element is a positive electrode thereof.

The positive electrode and the negative electrode of the resistive switching element enable the resistive switching element to change from a high resistance state into a low resistance state as forward bias that is high enough is applied to the positive electrode, and to change from the low resistance state into the high resistance state as forward bias that is high enough is applied to the negative electrode.

It should be noted that in this embodiment, as the first input end is low level, and the second input end is high level, a storage state of the first resistive switching element $M_1$ is to be changed into a low resistance state, and thus storing a logic 1, and a storage state of the second resistive switching element $M_2$ is to be changed into a high resistance state, and thus storing a logic 0; as the first input end is high level, and the second input end is low level, the storage state of the first resistive switching element $M_1$ is to be changed into a high resistance state, and thus storing a logic 0, and the storage state of the second resistive switching element $M_2$ is to be changed into a low resistance state, and thus storing a logic 1. As both the first input end and the second input end are high level or low level, each of the first resistive switching element $M_1$ and the second resistive switching element $M_2$ is to maintain in an initial state. A read voltage that is applied during read operation is not to affect the state of the resistive switching element.

To facilitate Boolean logic operation, three steps are required in one exemplary embodiment: a first step is to write initial states of the resistive switching element in the logic operation circuit: writing operation as a signal applied to the first input end is high level, and a signal applied to the second input end is low level is labeled as W, and referred to as forward writing. Writing operation as the signal applied to the first input end is low level, and the signal applied to the second input end is high level is labeled as $\overline{W}$, and referred to as reverse writing. In the step of writing initial states, if the first input end is high level, and the second input end is low level, namely W=1, $\overline{W}$=0; after the step, the state of the first resistive switching element $M_1$ is changed into the high resistance state, and the state of the second resistive switching element $M_2$ is changed into the low resistance state. In the step of writing initial states, if the first input end is low level, and the second input end is high level, namely W=0, $\overline{W}$=1; after the step, the state of the first resistive switching element $M_1$ is changed into the low resistance state, and the state of the second resistive switching element $M_2$ is changed into the high resistance state.

Next is to conduct logic operation on the logic operation circuit: a signal A is input to the first input end, and a signal B is input to the second input end, which facilitate Boolean logic operation. This step does not directly generate operation results, but storing the operation results in the first resistive switching element $M_1$ and the second resistive switching element $M_2$. For example, as the initial state is W=1, an initial state of the first resistive switching element $M_1$ is the high resistance state, and an initial state of the second resistive switching element $M_2$ is the low resistance state. As A=0 and B=0, the first resistive switching element $M_1$ maintains in the high resistance state, and the second resistive switching element $M_2$ maintains in the low resistance state. As A=1 and B=1, the first resistive switching element $M_1$ maintains in the high resistance state, and the second resistive switching element $M_2$ maintains in the low resistance state. As A=1 and B=0, the first resistive switching element $M_1$ maintains in the high resistance state, and the second resistive switching element $M_2$ maintains in the low resistance state. Only if A=0 and B=1, the state of the first resistive switching element $M_1$ is changed into the low resistance state, and the state of the second resistive switching element $M_2$ is changed into the high resistance state. As the initial state is $\overline{W}$=1, the initial state of the first resistive switching element $M_1$ is the low resistance state, and the initial state of the second resistive switching element $M_2$ is the high resistance state. As A=0 and B=0, the first resistive switching element $M_1$ maintains in the low resistance state, and the second resistive switching element $M_2$ maintains in the high resistance state. As A=1 and B=1, the first resistive switching element $M_1$ maintains in the low resistance state, and the second resistive switching element $M_2$ maintains in the high resistance state. As A=0 and B=1, the first resistive switching element $M_1$ maintains in the low resistance state, and the second resistive switching element $M_2$ maintains in the high resistance state. Only if A=1 and B=0, the state of the first resistive switching element $M_1$ is changed into the high resistance state, and the state of the second resistive switching element $M_2$ is changed into the low resistance state.

A final step is to read out the operation results: an impedance state of the first resistive switching element $M_1$ that is read out is labeled as R, and an impedance state of the second resistive switching element $M_2$ that is read out is labeled as $\overline{R}$. If read operation is conducted on the first resistive switching element $M_1$, R=1, and $\overline{R}$=0, and if read operation is conducted on the second resistive switching element $M_2$, R=0, and $\overline{R}$=1. By taking these three steps, it is possible to obtain the operation results that are associated with the initial state, the logic operation, as well as a direction of the read operation. For example, as R=1, a logic 1 is read out if the first resistive switching element $M_1$ is in the low resistance state, and a logic 0 is read out if first resistive switching element $M_1$ is in the high resistance state. As $\overline{R}$=1, a logic 1 is read out if the second resistive switching element $M_2$ is in the low resistance state, and a logic 0 is read out if second resistive switching element $M_2$ is in the high resistance state.

After completing the above-mentioned three steps, a complete logic operation is facilitated and expressed as $L = A \cdot \overline{B} \cdot \overline{W} \cdot \overline{R} + (\overline{A}+B) \cdot \overline{W} \cdot R + \overline{A} \cdot B \cdot W \cdot R + (A+\overline{B}) \cdot W \cdot \overline{R}$; where A represents a signal input to the first input end, B represents a signal input to the second input end, W represents a write direction of initialization, and R represents a readout direction of the operation result.

W=1 represents forward write direction of initialization, W=0 represents reverse write direction of initialization, R=1 represents readout of a storage state of the first resistive switching element $M_1$, and R=0 represents readout of a storage state of the second resistive switching element $M_2$.

Sixteen types of Boolean logic operation are listed below based on the above-mentioned expression, and it should be obvious to those skilled in the art that they are not all logic operation that can be facilitated thereby, and a method for facilitating these sixteen types of Boolean logic operation is not unique. Based on the teachings of the invention, all other embodiments obtained by those skilled in the art without creative work shall fall into the scope of the invention.

facilitating logic 0: W=0, A=0, B=0, and R=0;

namely setting: reverse writing, a signal A input to the first input end of 0, a signal B input to the second input end of 0, and reverse readout;

facilitating logic 1: W=0, A=1, B=0, and R=0;

namely setting: reverse writing, a signal A input to the first input end of 1, a signal B input to the second input end of 0, and reverse readout;

facilitating logic operation of P: W=0, A=P, B=0, and R=0;

namely setting: reverse writing, a signal A input to the first input end of P, a signal B input to the second input end of 0, and reverse readout;

facilitating logic operation of Q: W=1, A=0, B=Q, and R=1;

namely setting: forward writing, a signal A input to the first input end of 0, a signal B input to the second input end of Q, and forward readout;

facilitating logic operation of $\overline{P}$: W=1, A=P, B=1, and R=1;

namely setting: forward writing, a signal A input to the first input end of P, a signal B input to the second input end of 1, and forward readout;

facilitating logic operation of $\overline{Q}$: A=1, B=Q, W=0, and R=0;

namely setting: reverse writing, a signal A input to the first input end of 1, a signal B input to the second input end of Q, and reverse readout;

facilitating logic operation of P+$\overline{Q}$: A=P, B=Q, W=1, and R=0;

namely setting: forward writing, a signal A input to the first input end of P, a signal B input to the second input end of Q, and reverse readout;

facilitating logic operation of $\overline{P}$+Q: A=P, B=Q, W=0, and R=1;

namely setting: reverse writing, a signal A input to the first input end of P, a signal B input to the second input end of Q, and forward readout;

facilitating logic operation of $\overline{P}$·Q: A=P, B=Q, W=1, and R=1;

namely setting: forward writing, a signal A input to the first input end of P, a signal B input to the second input end of Q, and forward readout;

facilitating logic operation of P·$\overline{Q}$: A=P, B=Q, W=0, and R=0;

namely setting: reverse writing, a signal A input to the first input end of P, a signal B input to the second input end of Q, and reverse readout;

facilitating logic operation of P·Q: A=Q, B=P, W=0, and R=Q;

namely setting: reverse writing, a signal A input to the first input end of Q, a signal B input to the second input end of P, and readout direction of Q;

facilitating logic operation of $\overline{P}$·$\overline{Q}$: A=Q, B=P, W=1, and R=Q;

namely setting: forward writing, a signal A input to the first input end of Q, a signal B input to the second input end of P, and readout direction of Q;

facilitating logic operation of P+Q: A=Q, B=P, W=0, and R=P;

namely setting: reverse writing, a signal A input to the first input end of Q, a signal B input to the second input end of P, and readout direction of P;

facilitating logic operation of $\overline{P}$+$\overline{Q}$: A=Q, B=P, W=1, and R=P;

namely setting: forward writing, a signal A input to the first input end of Q, a signal B input to the second input end of P, and readout direction of P;

facilitating logic operation of $\overline{P}$·$\overline{Q}$+P·Q: A=P, B=0, W=0, and R=Q;

namely setting: reverse writing, a signal A input to the first input end of P, a signal B input to the second input end of 0, and readout direction of Q;

facilitating logic operation of P·Q+$\overline{P}$·$\overline{Q}$: A=0, B=P, W=1, and R=Q;

namely setting: forward writing, a signal A input to the first input end of P, a signal B input to the second input end of 0, and readout direction of Q.

Figure 6:
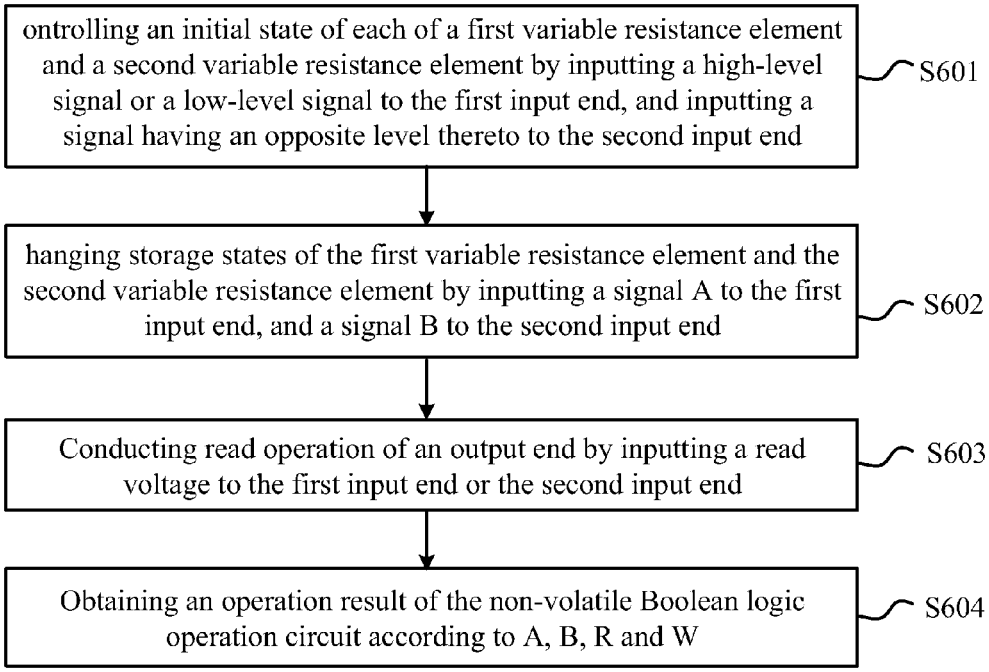
FIG. 6 is a flowchart illustrating an operation method of the non-volatile Boolean logic operation circuit of the first exemplary embodiment of the invention.

FIG. 6 is a flowchart illustrating an operation method of the non-volatile Boolean logic operation circuit of the first exemplary embodiment of the invention. The method can be applied to any of the above-mentioned logic operation circuits (structure thereof has been described with respect to FIG. 5 and corresponding embodiments, and will not be repeated hereinafter), and comprises steps of:

S601: controlling an initial state of each of a first resistive switching element and a second resistive switching element by inputting a high-level signal or a low-level signal to the first input end, and inputting a signal having an opposite level thereto to the second input end;

an initial state of the first resistive switching element is written as a high resistance state (namely the initial state of the first resistive switching element is written as 0) as a signal input to the first input end is high level and a signal input to the second input end is low level, and an initial state of the second resistive switching element is written as a low resistance state (namely the initial state of the second resistive switching element is written as 1), and this type of writing is labeled as forward writing W=1;

the initial state of the first resistive switching element being written as a low resistance state (namely the initial state of the first resistive switching element is written as 1) as the signal input to the first input end is low level and the signal input to the second input end is high level, and the initial state of the second resistive switching element being written as a high resistance state (namely the initial state of the second resistive switching element is written as 0), and this type of writing being labeled as reverse writing $\overline{W}$=1;

S602: changing storage states of the first resistive switching element and the second resistive switching element by inputting a signal A to the first input end, and a signal B to the second input end;

the storage state of the first resistive switching element is changed from the initial state to the low resistance state, and the storage state of the second resistive switching element is changed from the initial state to the high resistance state as the signal A is low level and the signal B is high level;

the storage state of the first resistive switching element is changed from the initial state to the high resistance state, and the storage state of the second resistive switching element is changed from the initial state to the low resistance state as the signal A is high level and the signal B is low level;

the first resistive switching element and the second resistive switching element are maintained in the initial state as both the signal A and the signal B are high level or low level;

S603: conducting read operation of an output end by inputting a read voltage to the first input end or the second input end;

the storage state of the first resistive switching element is obtained by reading a current of the first resistive switching element at the output end as the first read voltage is input to the first input end and the second input end is suspended, and this type of reading is labeled as R=1;

the storage state of the second resistive switching element is obtained by reading a current of the second resistive switching element at the output end as the first input end is suspended and the second read voltage is input to the second input end, and this type of reading is labeled as $\overline{R}$=1;

an amplitude of the read voltage is less than that of a voltage of each of the resistive switching elements as resistive switching occurs, namely a threshold voltage thereof;

S604: obtaining an operation result of the non-volatile Boolean logic operation circuit according to A, B, R and W: L=A·$\overline{B}$·W·$\overline{R}$+($\overline{A}$+B)·$\overline{W}$·R+$\overline{A}$·B·W·R+(A+$\overline{B}$)·W·$\overline{R}$; where A represents a signal input to the first input end, B represents a signal input to the second input end, W represents a write direction of initialization, and R represents a readout direction of the operation result. Sixteen types of Boolean logic operation are facilitated by adjusting values of A, B, W and R.

Readout of operation results of the first resistive switching element or the second resistive switching element is facilitated by controlling a voltage at the first input end to be a first read voltage, or a voltage at the second input end to be a second read voltage.

As the first read voltage is input from the first input end, the second input end is suspended, and by detecting a readout signal, namely a current flowing through the first resistive switching element, it is possible to determine an impedance state of the first resistive switching element, namely a logic stored thereby. This type of reading is labeled as R=1; As the second read voltage is input from the second input end, the first input end is suspended, and by detecting a readout signal, namely a current flowing through the second resistive switching element, it is possible to determine an impedance state of the second resistive switching element, namely a logic stored thereby. This type of reading is labeled as $\overline{R}=1$.

The first read voltage and the second read voltage make it possible to read a high resistance state or a low resistance state of the resistive switching element without causing a state thereof to be changed.

Technical solution of the invention will be explained hereinafter with respect to specific embodiments, which can be combined with each other in different manners, and it should be understood that identical or similar concepts or procedures will not be repeated in some embodiments.

FIG. 7 is a schematic diagram of a non-volatile Boolean logic operation circuit of a second exemplary embodiment of the invention. For the purpose of clear illustration and as an example, a resistive switching element is labeled as a memristor in FIG. 7. It can be understood by those skilled in the art that the resistive switching element can be a magnetic random access memory (comprising a spin transfer torque magnetic random access memory (STT-MRAM), a magnetic tunnel junction element (MTJ), a spin valve an so on), a resistive memory, a phase change memory, or other types of resistive switching elements that are capable of reversely changing states in the high resistance state or the low resistance state. As shown in FIG. 7, the logic operation circuit of the second embodiment comprises a third resistive switching element $M_3$, and a fourth resistive switching element $M_4$.

A first end 712 of the third resistive switching element $M_3$ operates as a first input end of the logic operation circuit.

A first end 722 of the fourth resistive switching element $M_4$ operates as a second input end of the logic operation circuit. A second end 721 of the fourth resistive switching element $M_4$ is connected to a second end 711 of the third resistive switching element $M_3$, and operates as an output end F of the logic operation circuit for outputting signals.

The first end of the resistive switching element is a positive electrode thereof, and the second end of resistive switching element is a negative electrode thereof.

The positive electrode and the negative electrode of the resistive switching element enable the resistive switching element to change from a high resistance state into a low resistance state as forward bias that is high enough is applied to the positive electrode, and to change from the low resistance state into the high resistance state as forward bias that is high enough is applied to the negative electrode.

It should be noted that in this embodiment, as the third input end is low level, and the fourth input end is high level, a storage state of the third resistive switching element $M_3$ is to be changed into a low resistance state, and thus storing a logic 1, and a storage state of the fourth resistive switching element $M_4$ is to be changed into a high resistance state, and thus storing a logic 0; as the third input end is high level, and the fourth input end is low level, the storage state of the third resistive switching element $M_3$ is to be changed into a high resistance state, and thus storing a logic 0, and the storage state of the fourth resistive switching element $M_4$ is to be changed into a low resistance state, and thus storing a logic 1. As both the third input end and the fourth input end are high level or low level, each of the third resistive switching element $M_3$ and the fourth resistive switching element $M_4$ is to maintain in an initial state. A read voltage that is applied during read operation is not to affect the state of the resistive switching element.

To facilitate Boolean logic operation, three steps are required in one exemplary embodiment: a first step is to write initial states of the resistive switching element in the logic operation circuit: writing operation as a signal applied to the third input end is high level, and a signal applied to the fourth input end is low level is labeled as W, and referred to as forward writing. Writing operation as the signal applied to the third input end is low level, and the signal applied to the fourth input end is high level is labeled as $\overline{W}$, and referred to as reverse writing. In the step of writing initial states, if the third input end is high level, and the fourth input end is low level, namely W=1, $\overline{W}$=0; after the step, the state of the third resistive switching element $M_3$ is changed into the high resistance state, and the state of the fourth resistive switching element $M_4$ is changed into the low resistance state. In the step of writing initial states, if the third input end is low level, and the fourth input end is high level, namely W=0, $\overline{W}$=1; after the step, the state of the third resistive switching element $M_3$ is changed into the low resistance state, and the state of the fourth resistive switching element $M_4$ is changed into the high resistance state.

Next is to conduct logic operation on the logic operation circuit: a signal D is input to the third input end, and a signal E is input to the fourth input end, which facilitate Boolean logic operation. This step does not directly generate operation results, but storing the operation results in the third resistive switching element $M_3$ and the fourth resistive switching element $M_4$. For example, as the initial state is W=1, an initial state of the third resistive switching element $M_3$ is the low resistance state, and an initial state of the fourth resistive switching element $M_4$ is the high resistance state. As D=0 and E=0, the third resistive switching element $M_3$ maintains in the low resistance state, and the fourth resistive switching element $M_4$ maintains in the high resistance state. As D=1 and E=1, the third resistive switching element $M_3$ maintains in the low resistance state, and the fourth resistive switching element $M_4$ maintains in the high resistance state. As D=1 and E=0, the third resistive switching element $M_3$ maintains in the low resistance state, and the fourth resistive switching element $M_4$ maintains in the high resistance state. Only if D=0 and E=1, the state of the third resistive switching element $M_3$ is changed into the high resistance state, and the state of the fourth resistive switching element $M_4$ is changed into the low resistance state. As the initial state is $\overline{W}$=1, the initial state of the third resistive switching element $M_3$ is the high resistance state, and the initial state of the fourth resistive switching element $M_4$ is the low resistance state. As D=0 and E=0, the third resistive switching element $M_1$ maintains in the high resistance state, and the fourth resistive switching element $M_2$ maintains in the low resistance state. As D=1 and E=1, the third resistive switching element $M_3$ maintains in the high resistance state, and the fourth resistive switching element $M_4$ maintains in the low resistance state. As D=0 and E=1, the third resistive switching element $M_3$ maintains in the high resistance state, and the fourth resistive switching element $M_4$ maintains in the low resistance state. Only if D=1 and E=0, the state of the third resistive switching element $M_3$ is changed into the low resistance state, and the state of the fourth resistive switching element $M_4$ is changed into the high resistance state.

A final step is to read out the operation results: an impedance state of the third resistive switching element $M_3$ that is read out is labeled as R, and an impedance state of the fourth resistive switching element $M_4$ that is read out is labeled as $\overline{R}$. If read operation is conducted on the third resistive switching element $M_3$, R=1, and $\overline{R}$=0, and if read operation is conducted on the fourth resistive switching element $M_4$, R=0, and $\overline{R}$=1. By taking these three steps, it is possible to obtain the operation results that are associated with the initial state, the logic operation, as well as a direction of the read operation. For example, as R=1, a logic 1 is read out if the third resistive switching element $M_3$ is in the low resistance state, and a logic 0 is read out if third resistive switching element $M_3$ is in the high resistance state. As $\overline{R}$=1, a logic 1 is read out if the fourth resistive switching element $M_4$ is in the low resistance state, and a logic 0 is read out if fourth resistive switching element $M_4$ is in the high resistance state.

After completing the above-mentioned three steps, a complete logic operation is facilitated and expressed as $L=D\cdot\overline{E}\cdot W\cdot R+(\overline{D}+E)\cdot\overline{W}\cdot R+\overline{D}\cdot E\cdot W\cdot\overline{R}+(D+\overline{E})\cdot W\cdot R$; where D represents a signal input to the third input end, E represents a signal input to the second input end, W represents a write direction of initialization, and R represents a readout direction of the operation result.

W=1 represents forward write direction of initialization, W=0 represents reverse write direction of initialization, R=1 represents readout of a storage state of the third resistive switching element $M_3$, and R=0 represents readout of a storage state of the fourth resistive switching element $M_4$.

Sixteen types of Boolean logic operation are listed below based on the above-mentioned expression, and it should be obvious to those skilled in the art that they are not all logic operation that can be facilitated thereby, and a method for facilitating these sixteen types of Boolean logic operation is not unique. Based on the teachings of the invention, all other embodiments obtained by those skilled in the art without creative work shall fall into the scope of the invention.

facilitating logic 0: D=0, E=0, W=0, and R=1;

namely setting: reverse writing, a signal D input to the third input end of 0, a signal E input to the fourth input end of 0, and forward readout;

facilitating logic 1: D=1, E=0, W=0, and R=1;

namely setting: reverse writing, a signal D input to the third input end of 1, a signal E input to the fourth input end of 0, and forward readout;

facilitating logic operation of P: D=P, E=0, W=0, and R=1;

namely setting: reverse writing, a signal D input to the third input end of P, a signal E input to the fourth input end of 0, and forward readout;

facilitating logic operation of Q: D=0, E=Q, W=1, and R=0;

namely setting: forward writing, a signal D input to the third input end of 0, a signal E input to the fourth input end of Q, and reverse readout;

facilitating logic operation of $\overline{P}$: D=P, E=1, W=1, and R=0;

namely setting: forward writing, a signal D input to the third input end of P, a signal E input to the fourth input end of 1, and reverse readout;

facilitating logic operation of $\overline{Q}$: D=1, E=Q, W=0, and R=1;

namely setting: reverse writing, a signal D input to the third input end of 1, a signal E input to the fourth input end of Q, and forward readout;

facilitating logic operation of P+Q: D=P, E=Q, W=1, and R=1;

namely setting: forward writing, a signal D input to the third input end of P, a signal E input to the fourth input end of Q, and forward readout;

facilitating logic operation of $\overline{P}$+Q: D=P, E=Q, W=0, and R=0;

namely setting: reverse writing, a signal D input to the third input end of P, a signal E input to the fourth input end of Q, and reverse readout;

facilitating logic operation of $\overline{P}\cdot Q$: D=P, E=Q, W=1, and R=0;

namely setting: forward writing, a signal D input to the third input end of P, a signal E input to the fourth input end of Q, and reverse readout;

facilitating logic operation of $P\cdot\overline{Q}$: D=P, E=Q, W=0, and R=1;

namely setting: reverse writing, a signal D input to the third input end of P, a signal E input to the fourth input end of Q, and forward readout;

facilitating logic operation of $P\cdot Q$: D=P, E=Q, W=1, R=Q;

namely setting: forward writing, a signal D input to the third input end of P, a signal E input to the fourth input end of Q, and readout direction of Q;

facilitating logic operation of $\overline{P}\cdot\overline{Q}$: D=P, E=Q, W=0, R=Q;

namely setting: reverse writing, a signal D input to the third input end of P, a signal E input to the fourth input end of Q, and readout direction of Q;

facilitating logic operation of P+Q: D=P, E=Q, W=1, R=P;

namely setting: forward writing, a signal D input to the third input end of P, a signal E input to the fourth input end of Q, and readout direction of P;

facilitating logic operation of $\overline{P}+\overline{Q}$: D=P, E=Q, W=0, R=P;

namely setting: reverse writing, a signal D input to the third input end of P, a signal E input to the fourth input end of Q, and readout direction of P;

facilitating logic operation of $\overline{P}\cdot Q+P\cdot\overline{Q}$: D=0, E=P, W=1, R=Q;

namely setting: forward writing, a signal D input to the third input end of 0, a signal E input to the fourth input end of P, and readout direction of Q;

facilitating logic operation of $P\cdot Q+\overline{P}\cdot\overline{Q}$: D=P, E=0, W=0, R=Q;

namely setting: reverse writing, a signal D input to the third input end of P, a signal E input to the fourth input end of 0, and readout direction of Q.

FIG. 8 is a flowchart illustrating an operation method of the non-volatile Boolean logic operation circuit of the second exemplary embodiment of the invention. The method can be applied to any of the above-mentioned logic operation circuits (structure thereof has been described with respect to FIG. 7 and corresponding embodiments, and will not be repeated hereinafter), and comprises steps of:

S801: controlling an initial state of each of a third resistive switching element and a fourth resistive switching element by inputting a high-level signal or a low-level signal to the third input end, and inputting a signal having an opposite level thereto to the fourth input end;

an initial state of the third resistive switching element is written as a high resistance state (namely the initial state of the third resistive switching element is written as 0) as a signal input to the third input end is high level and a signal input to the fourth input end is low level, and an initial state of the fourth resistive switching element is written as a low resistance state (namely the initial state of the fourth resistive switching element is written as 1), and this type of writing is labeled as forward writing W;

the initial state of the third resistive switching element being written as a low resistance state (namely the initial state of the third resistive switching element is written as 1) as the signal input to the third input end is low level and the signal input to the fourth input end is high level, and the initial state of the fourth resistive switching element being written as a high resistance state (namely the initial state of the fourth resistive switching element is written as 0), and this type of writing being labeled as reverse writing $\overline{W}$;

S802: changing storage states of the third resistive switching element and the fourth resistive switching element by inputting a signal D to the third input end, and a signal E to the fourth input end;

the storage state of the third resistive switching element is changed from the initial state to the high resistance state, and the storage state of the fourth resistive switching element is changed from the initial state to the low resistance state as the signal D is low level and the signal E is high level;

the storage state of the third resistive switching element is changed from the initial state to the low resistance state, and the storage state of the fourth resistive switching element is changed from the initial state to the high resistance state as the signal D is high level and the signal E is low level;

the third resistive switching element and the fourth resistive switching element are maintained in the initial state as both the signal D and the signal E are high level or low level;

S803: conducting read operation of an output end by inputting a read voltage to the third input end or the fourth input end;

the storage state of the third resistive switching element is obtained by reading a current of the third resistive switching element at the output end as a third read voltage is input to the third input end and the second input end is suspended, and this type of reading is labeled as R;

the storage state of the fourth resistive switching element is obtained by reading a current of the fourth resistive switching element at the output end as the third input end is suspended and the fourth read voltage is input to the second input end, and this type of reading is labeled as $\overline{R}$;

an amplitude of the read voltage is less than that of a voltage of each of the resistive switching elements as resistive switching occurs, namely a threshold voltage thereof.

As the third read voltage is input from the third input end, the fourth input end is suspended, and by detecting a readout signal, namely a current flowing through the third resistive switching element, it is possible to determine an impedance state of the third resistive switching element, namely a logic stored thereby. This type of reading is labeled as R; As the fourth read voltage is input from the fourth input end, the third input end is suspended, and by detecting a readout signal, namely a current flowing through the fourth resistive switching element, it is possible to determine an impedance state of the fourth resistive switching element, namely a logic stored thereby. This type of reading is labeled as $\overline{R}$.

The third read voltage and the fourth read voltage make it possible to read a high resistance state or a low resistance state of the resistive switching element without causing a state thereof to be changed.

S804: obtaining an operation result of the non-volatile Boolean logic operation circuit according to D, E, R and W: $L = D \cdot E \cdot \overline{W} \cdot R + (\overline{D} + E) \cdot \overline{W} \cdot \overline{R} + \overline{D} \cdot E \cdot W \cdot \overline{R} + (D + \overline{E}) \cdot W \cdot R$; where D represents a signal input to the third input end, E represents a signal input to the fourth input end, W represents a write direction of initialization, and R represents a readout direction of the operation result.

Sixteen types of Boolean logic operation are facilitated by adjusting values of D, E, W and R.

Figure 9:
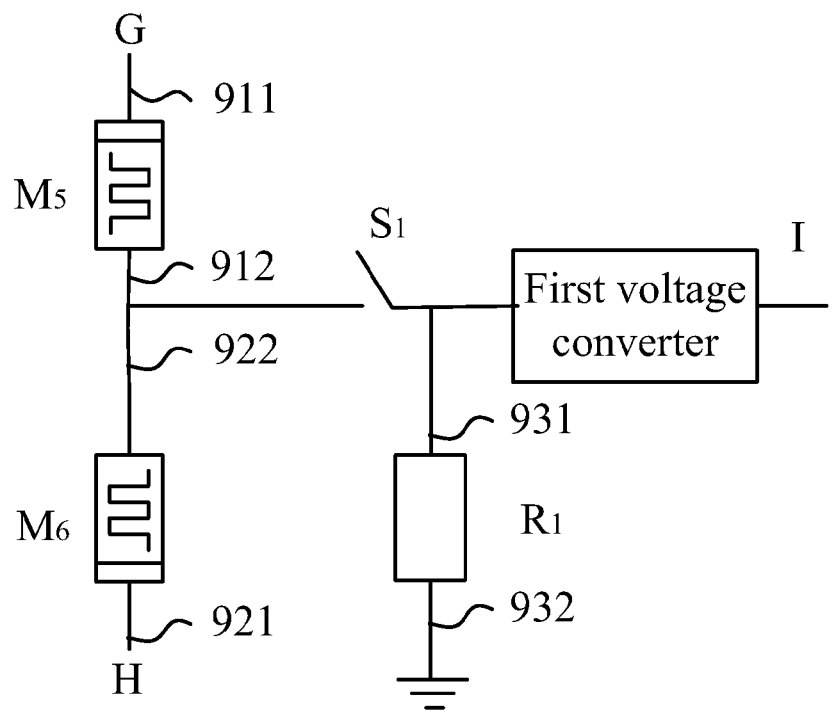
FIG. 9 is a schematic diagram of a non-volatile Boolean logic operation circuit of a third exemplary embodiment of the invention.

Except for the method of using the current flowing through the resistive switching element in the first embodiment and the second embodiment, a method of using a voltage dividing method to read a storage state in the resistive switching element can also be used. FIG. 9 illustrates a schematic diagram of a non-volatile Boolean logic operation circuit of a third exemplary embodiment of the invention using the voltage dividing method to read operation results in the resistive switching element. As shown in FIG. 9, the logic operation circuit comprises: a fifth resistive switching element $M_5$, a sixth resistive switching element $M_6$, a first resistor $R_1$, a first switching element $S_1$, and a first voltage converter.

A first end 911 of the fifth resistive switching element $M_5$ operates as a first input end of the logic operation circuit.

A first end 921 of the sixth resistive switching element $M_6$ operates as a second input end of the logic operation circuit, a second end 922 of the sixth resistive switching element $M_6$ is connected to a second end 912 of the fifth resistive switching element $M_5$, and further to a first end of the first switching element, and a second end of the first switching element is connected to the ground.

A first end of the first voltage converter is connected to a first end of the first resistor, and a second end of the first voltage converter operates as an output end of the logic operation circuit.

The first input end and the second input end of the logic operation circuit operate to input signals, and the output end of the logic operation circuit operates to output signals.

Difference between this embodiment and foregoing two embodiments is that, readout signals in those two embodiments are current signals, while a readout signal in this embodiment is a standard logic level signal.

It should be pointed out herein that, a resistance of the first resistor is far less than that of the resistive switching element in the high resistance state, and far greater than that of the resistive switching element in the low resistance state. Thus, the read voltage is equivalently deemed to be completely applied to the voltage dividing resistor as the resistive switching element is in the low resistance state, and to the resistive switching element as the resistive switching element is in the high resistance state It is well-known that as a voltage at the input end of the first voltage converter is $R/(R+R_m) V_r$, the first voltage converter is to transform a voltage less than $R/(R+R_L) V_r$ into standard low level, and a voltage greater than $R/(R+R_h)$ $V_r$ into standard high level. Therefore, a threshold value of the first voltage converter ranges from $R/(R+R_L)V_r$ to $R/(R+R_h)V_r$. If the threshold value of the first voltage converter is within the range, requirement for the voltage dividing resistor is not that strict, and there will be no limitation on a resistance thereof. R represents a resistance of the first resistor, $R_m$ represents a resistance of each of the resistive switching elements, RL represents a resistance of each of the resistive switching elements in a low resistance state, $R_h$ represents a resistance of each of the resistive switching elements in a high resistance state, and Vr represents a magnitude of the read voltage.

The read voltage $V_r$ is so that no state variation of the resistive switching element occurs, and is less than a resistive switching voltage.

Difference between an operation method of the logic operation circuit of this embodiment and that of the first embodiment comprises:

the first voltage control switch is switched off in the first and the second steps of the method;

the first voltage control switch is switched on during read operation;

read operation at the third output end is conducted by inputting a voltage to the fifth input end or the sixth input end.

An impedance state of the fifth resistive switching element (namely a logic stored thereby) is obtained by reading a voltage applied to the first resistor as an input of the first voltage converter and transformed into high level or low level, as the third read voltage is input to the third input end and the second input end is suspended, and this type of reading is labeled as R;

An impedance state of the third resistive switching element (namely a logic stored thereby) is obtained by reading a voltage applied to the first resistor as an input of the first voltage converter and transformed into high level or low level, as the fourth read voltage is input to the second input end and the third input end is suspended, and this type of reading is labeled as $\overline{R}$;

An amplitude of the read voltage is less than that of a voltage of the resistive switching element as resistive switching occurs, namely a threshold voltage thereof.

An obvious benefit of reading logic states using the voltage-dividing method is that it can be directly used for concatenation.

Figure 10:
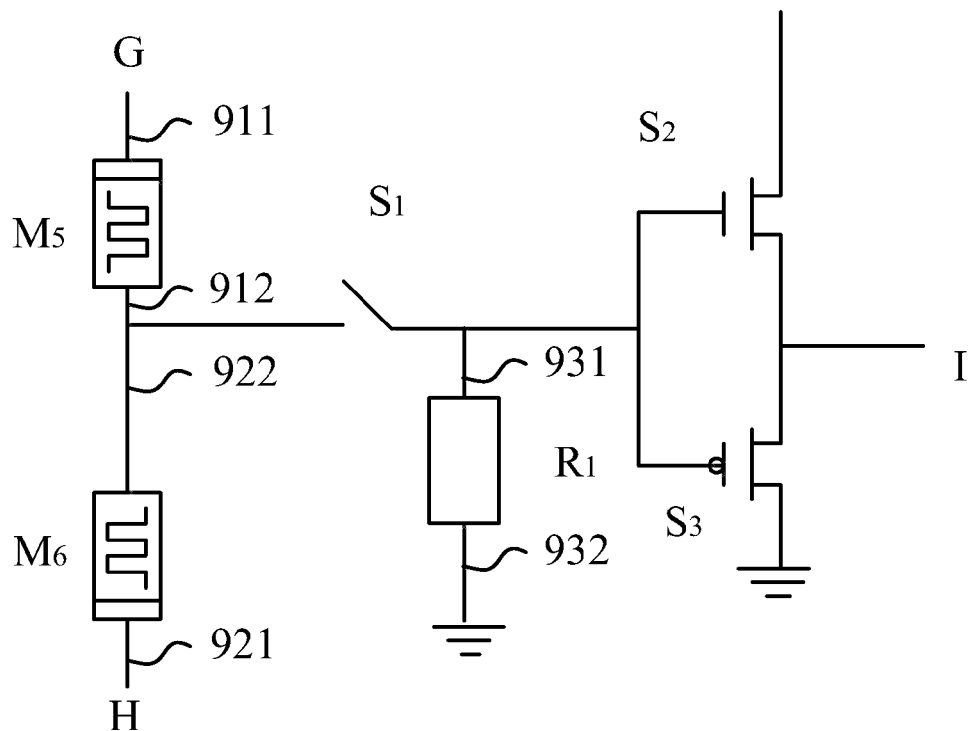
FIG. 10 is a schematic diagram of a non-volatile Boolean logic operation circuit of a fourth exemplary embodiment of the invention.

FIG. 10 illustrates a schematic diagram of a non-volatile Boolean logic operation circuit of a fourth exemplary embodiment of the invention. Difference between this embodiment and the third embodiment in FIG. 9 is that, in this embodiment, the voltage converter is formed by a pair of voltage control switches. In this embodiment, the voltage control switch is a field effect transistor. Referring to FIG. 10, the non-volatile Boolean logic operation circuit of this embodiment comprises: a fifth resistive switching element $M_5$, an sixth resistive switching element $M_6$, a first resistor $R_1$ (voltage dividing resistor), a field effect transistor $S_1$, a field effect transistor $S_2$, and a field effect transistor $S_3$. The field effect transistor $S_2$ and the field effect transistor $S_3$ form a voltage converter, and a polarity of the field effect transistor $S_2$ is opposite to that of the field effect transistor $S_3$, namely, if the field effect transistor $S_2$ employs a N-type field effect transistor, the field effect transistor $S_3$ employs a P-type field effect transistor, as the field effect transistor $S_2$ employs the P-type field effect transistor, the field effect transistor $S_3$ employs the N-type field effect transistor.

A first end 911 of the fifth resistive switching element $M_5$ operates as a first input end of the logic operation circuit, a first end 921 of the sixth resistive switching element $M_6$ operates as a second input end of the logic operation circuit, a second end 922 of the sixth resistive switching element $M_6$ is connected to a second end 912 of the fifth resistive switching element $M_5$, and then to a first end of the first switching element. A second end of the first switching element is connected to the ground. The first input end and the second input end of the logic operation circuit operate to input signals, and a third end thereof operates to output signals. A gate of the field effect transistor $S_2$ is connected to a first end of the first resistor, a drain of the field effect transistor $S_2$ is connected to an external power supply, and a source of the field effect transistor $S_2$ is an output end. A gate of the field effect transistor $S_3$ is connected to the first end of the first resistor, a drain of the field effect transistor $S_3$ is connected to the ground, and a source of the field effect transistor $S_3$ operates as the output end.

It is well-known that as a voltage at the input end of the first voltage converter is $R/(R+R_m)$ $V_r$, the first voltage converter is to transform a voltage less than $R/(R+R_L)$ $V_r$ into standard low level, and a voltage greater than $R/(R+R_h)$ $V_r$ into standard high level. Therefore, a threshold value of the first voltage converter ranges from $R/(R+R_L)Vr$ to $R/(R+R_h)V_r$. If the threshold value of the first voltage converter is within the range, requirement for the voltage dividing resistor is not that strict, and there will be no limitation on a resistance thereof.

R represents a resistance of the first resistor, $R_m$ represents a resistance of each of the resistive switching elements, RL represents a resistance of each of the resistive switching elements in a low resistance state, Rh represents a resistance of each of the resistive switching elements in a high resistance state, and Vr represents a magnitude of the read voltage.

The read voltage $V_r$ is so that no state variation of the resistive switching element occurs, and is less than a resistive switching voltage.

Operation principle of the voltage converter is: an input voltage of the voltage converter is $(R/(R_m+R))$ $V_r$, which enables the field effect transistors $S_2$ and $S_3$ having opposite polarity to be in two opposite states. If the resistive switching element is in the low resistance state, and a voltage applied thereto is $R/(R+R_L)V_r$, $S_2$ is switched on and $S_3$ is switched off, and an output voltage thereof is $V_{DD}$; if the resistive memory is in the high resistance state, and a voltage applied thereto is $R/(R+R_h)$ $V_r$, $S_2$ is switched off, $S_3$ is switched on, and an output voltage is 0, where $V_{DD}$ represents high level in the logic operation circuit, and 0 represents low level in the logic operation circuit.

Operation of the non-volatile latch of this embodiment has been described with respect to FIG. 5 and corresponding embodiments, and will not be repeated herein.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A non-volatile Boolean logic operation circuit, comprising:
   a) a first resistive switching element, the first resistive switching element comprising a positive electrode and a negative electrode; and
   b) a second resistive switching element, the second resistive switching element comprising a positive electrode and a negative electrode;
   wherein:
   said negative electrode of said first resistive switching element operates as a first input end of said logic operation circuit and is adapted to receive a first input signal;
   said negative electrode of said second resistive switching element operates as a second input end of said logic operation circuit and is adapted to receive a second input signal; and
   said positive electrode of said second resistive switching element is connected to said positive electrode of said first resistive switching element, and a connected end thereof operates as an output end of said logic operation circuit and is adapted to output a logic operation result of the first input signal and the second input signal.

2. The circuit of claim 1, wherein
in operation, forward writing of an initial state W=1 is facilitated by applying high level to said first input end, and low level to said second input end, and reverse writing of said initial state $\overline{W}$=1 is facilitated by applying low level to said first input end, and high level to said second input end;
resistive switching of said first resistive switching element and said second resistive switching element is facilitated by inputting a signal A to said first input end, and a signal B to said second input end according to an initial state of each of said resistive switching elements, and results of said input signals A and B after logic operation are stored according to said resistive switching;
outputting of a storage state of said first resistive switching element is facilitated by inputting a read voltage to said first input end and suspending said second input end, and outputting of a storage state of said second resistive switching element is facilitated by inputting said read voltage to said second input end and suspending said first input end; and
said input signal A or said input signal B is a high-level signal or a low-level signal, and an amplitude of said read voltage is less than that of a voltage of each of said resistive switching elements as resistive switching occurs, namely a threshold voltage thereof.

3. The circuit of claim 1, wherein an operation result of said non-volatile Boolean logic operation circuit is expressed by: L=A·$\overline{B}$·W·R+($\overline{A}$+B)·$\overline{W}$·R+$\overline{A}$·B·W·R+(A+$\overline{B}$)·W·$\overline{R}$; where A represents a signal input to said first input end, B represents a signal input to said second input end, W represents a write direction of initialization, and R represents a readout direction of said operation result.

4. The circuit of claim 1, wherein said first resistive switching element and said second resistive switching element are memristors.

5. An operation method of the non-volatile Boolean logic operation circuit of claim 1, the method comprising:
1) controlling an initial state of each of said first resistive switching element and said second resistive switching element by inputting a high-level signal or a low-level signal to said first input end, and inputting a signal having an opposite level thereto to said second input end;
wherein:
an initial state of said first resistive switching element being written as a high resistance state as a signal input to said first input end is high level and a signal input to said second input end is low level, and an initial state of said second resistive switching element being written as a low resistance state, and this type of writing being labeled as forward writing W=1;
said initial state of said first resistive switching element being written as a low resistance state as said signal input to said first input end is low level and said signal input to said second input end is high level, and said initial state of said second resistive switching element being written as a high resistance state, and
this type of writing being labeled as reverse writing $\overline{W}$=1; and
said high resistance state of each of said resistive switching elements operating to store a logic 0, and said low resistance state of said resistive switching element operating to store a logic 1;
2) changing storage states of said first resistive switching element and said second resistive switching element by inputting a signal A to said first input end, and a signal B to said second input end;
wherein:
said storage state of said first resistive switching element being changed from said initial state to said low resistance state, and said storage state of said second resistive switching element being changed from said initial state to said high resistance state as said signal A is low level and said signal B is high level;
said storage state of said first resistive switching element being changed from said initial state to said high resistance state, and said storage state of said second resistive switching element being changed from said initial state to said low resistance state as said signal A is high level and said signal B is low level; and
said first resistive switching element and said second resistive switching element being maintained in said initial state as both said signal A and said signal B are high level or low level;
3) conducting read operation of an output end by inputting a read voltage to said first input end or said second input end;
wherein:
said storage state of said first resistive switching element being obtained by reading a current of said first resistive switching element at said output end as said read voltage is input to said first input end and said second input end is suspended, and this type of reading being labeled as R=1;
said storage state of said second resistive switching element being obtained by reading a current of said second resistive switching element at said output end as said first input end is suspended and said read voltage is input to said second input end, and this type of reading being labeled as $\overline{R}$=1; and
an amplitude of said read voltage being less than that of a voltage of each of said resistive switching elements as resistive switching occurs, namely a threshold voltage thereof; and
4) obtaining an operation result of said non-volatile Boolean logic operation circuit according to A, B, R and W: L=A·$\overline{B}$·W·R+($\overline{A}$+B)·$\overline{W}$·R+$\overline{A}$·B·W·R+(A+$\overline{B}$)·W·$\overline{R}$; where A represents a signal input to said first input end, B represents a signal input to said second input end, W represents a write direction of initialization, and R represents a readout direction of said operation result.

6. The method of claim 5, wherein sixteen types of Boolean logic operation are facilitated based on said operation result of said non-volatile Boolean logic operation circuit, and comprise:
1) facilitating logic 0 operation by applying high level and low level so that W=0, A=0, B=0, and R=0;
2) facilitating logic 1 operation by applying high level and low level so that W=0, A=1, B=0, and R=0;
3) facilitating logic operation of P by applying high level and low level so that W=0, A=P, B=0, and R=0, in which P is an input signal and has a value of 0 or 1;
4) facilitating logic operation of Q by applying high level and low level so that W=1, A=0, B=Q, and R=1, in which Q is an input signal and has a value of 0 or 1;
5) facilitating logic operation of $\overline{P}$ by applying high level and low level so that W=1, A=P, B=1, and R=1;
6) facilitating logic operation of $\overline{Q}$ by applying high level and low level so that A=1, B=Q, W=0, and R=0;
7) facilitating logic operation of P+$\overline{Q}$ by applying high level and low level so that A=P, B=Q, W=1, and R=0;

8) facilitating logic operation of $\overline{P}+Q$ by applying high level and low level so that A=P, B=Q, W=0, and R=1;
9) facilitating logic operation of $\overline{P}\cdot Q$ by applying high level and low level so that A=P, B=Q, W=1, and R=1;
10) facilitating logic operation of $P\cdot\overline{Q}$ by applying high level and low level so that A=P, B=Q, W=0, and R=0;
11) facilitating logic operation of $P\cdot Q$ by applying high level and low level so that A=Q, B=P, W=0, and R=Q;
12) facilitating logic operation of $\overline{P}\cdot\overline{Q}$ by applying high level and low level so that A=Q, B=P, W=1, and R=Q;
13) facilitating logic operation of P+Q by applying high level and low level so that A=Q, B=P, W=0, and R=P;
14) facilitating logic operation of $\overline{P}+\overline{Q}$ by applying high level and low level so that A=Q, B=P, W=1, and R=P;
15) facilitating logic operation of $\overline{P}\cdot Q+P\cdot\overline{Q}$ by applying high level and low level so that A=P, B=0, W=0, and R=Q; and
16) facilitating logic operation of $P\cdot Q+\overline{P}\cdot\overline{Q}$ by applying high level and low level so that A=0, B=P, W=1, and R=Q; where P and Q represent two operation signals in two input Boolean logics.

7. A non-volatile Boolean logic operation circuit, comprising:
a) a third resistive switching element, said third resistive switching element comprising a positive electrode and a negative electrode; and
b) a fourth resistive switching element, said fourth resistive switching element comprising a positive electrode and a negative electrode;
wherein:
said positive electrode of said third resistive switching element operates as a first input end of said logic operation circuit and is adapted to receive a first input signal;
said positive electrode of said fourth resistive switching element operates as a second input end of said logic operation circuit and is adapted to receive a second input signal; and
said negative electrode of said fourth resistive switching element is connected to said negative electrode of said third resistive switching element, and a connected end thereof operates as an output end of said logic operation circuit and is adapted to output a logic operation result of the first input signal and the second input signal.

8. The circuit of claim 7, wherein
in operation, forward writing of an initial state W=1 is facilitated by applying high level to said third input end, and low level to said fourth input end, and reverse writing of said initial state $\overline{W}$=1 is facilitated by applying low level to said third input end, and high level to said fourth input end;
resistive switching of said third resistive switching element and said fourth resistive switching element is facilitated by inputting a signal D to said third input end, and a signal E to said fourth input end according to an initial state of each of said resistive switching elements, and results of said input signals D and E after logic operation are stored according to said resistive switching;
outputting of a storage state of said third resistive switching element is facilitated by inputting a read voltage to said third input end and suspending said fourth input end, and outputting of a storage state of said fourth resistive switching element is facilitated by inputting said read voltage to said fourth input end and suspending said third input end; and said input signal D or said input signal E is a high-level signal or a low-level signal, and an amplitude of said read voltage is less than that of a voltage of each of said resistive switching elements as resistive switching occurs, namely a threshold voltage thereof.

9. The circuit of claim 7, wherein an operation result of said non-volatile Boolean logic operation circuit is expressed by: $L=D\cdot\overline{E}\cdot\overline{W}\cdot R+(\overline{D}+E)\cdot\overline{W}\cdot R+\overline{D}\cdot E\cdot W\cdot R+(D+E)\cdot W\cdot R$; where D represents a signal input to said third input end, E represents a signal input to said fourth input end, W represents a write direction of initialization, and R represents a readout direction of said operation result.

10. The circuit of claim 7, wherein said third resistive switching element and said fourth resistive switching element are memristors.

11. An operation method of the non-volatile Boolean logic operation circuit of claim 7, the method comprising:
controlling an initial state of each of said third resistive switching element and said fourth resistive switching element by inputting a high-level signal or a low-level signal to said third input end, and inputting a signal having an opposite level thereto to said fourth input end;
wherein:
1) an initial state of said third resistive switching element being written as a low resistance state as a signal input to said first input end is high level and a signal input to said fourth input end is low level, and an initial state of said fourth resistive switching element being written as a high resistance state, and this type of writing being labeled as forward writing W=1;
said initial state of said third resistive switching element being written as a high resistance state as said signal input to said third input end is low level and said signal input to said fourth input end is high level, and said initial state of said fourth resistive switching element being written as a low resistance state, and this type of writing being labeled as reverse writing $\overline{W}$=1; and
said high resistance state of each of said resistive switching elements operating to store a logic 0, and said low resistance state of said resistive switching element operating to store a logic 1;
2) changing storage states of said third resistive switching element and said fourth resistive switching element by inputting a signal D to said third input end, and a signal E to said fourth input end;
wherein:
said storage state of said third resistive switching element being changed from said initial state to said high resistance state, and said storage state of said fourth resistive switching element being changed from said initial state to said low resistance state as said signal D is low level and said signal E is high level;
said storage state of said third resistive switching element being changed from said initial state to said low resistance state, and said storage state of said fourth resistive switching element being changed from said initial state to said high resistance state as said signal D is high level and said signal E is low level; and
said third resistive switching element and said fourth resistive switching element being maintained in said initial state as both said signal D and said signal E are high level or low level;
3) conducting read operation of an output end by inputting a read voltage to said third input end or said fourth input end;

wherein:
said storage state of said third resistive switching element being obtained by reading a current of said third resistive switching element at said output end as said read voltage is input to said third input end and said fourth input end is suspended, and this type of reading being labeled as R=1;
said storage state of said fourth resistive switching element being obtained by reading a current of said fourth resistive switching element at said output end as said third input end is suspended and said read voltage is input to said fourth input end, and this type of reading being labeled as $\overline{R}$=1; and
an amplitude of said read voltage being less than that of a voltage of each of said resistive switching elements as resistive switching occurs, namely a threshold voltage thereof; and
4) obtaining an operation result of said non-volatile Boolean logic operation circuit according to D, E, R and W: $L = D \cdot E \cdot W \cdot R + (\overline{D} + E) \cdot W \cdot \overline{R} + \overline{D} \cdot E \cdot W \cdot \overline{R} + (D + E) \cdot W \cdot R$; where D represents a signal input to said third input end, E represents a signal input to said fourth input end, W represents a write direction of initialization, and R represents a readout direction of said operation result.

12. The method of claim 11, wherein sixteen types of Boolean logic operation are facilitated based on said operation result of said non-volatile Boolean logic operation circuit, and comprise:
1) facilitating logic 0 operation by applying high level and low level so that D=0, E=0, W=0, and R=1;
2) facilitating logic 1 operation by applying high level and low level so that D=1, E=0, W=0, and R=1;
3) facilitating logic operation of P by applying high level and low level so that D=P, E=0, W=0, and R=1, in which P is an input signal and has a value of 0 or 1;
4) facilitating logic operation of Q by applying high level and low level so that D=0, E=Q, W=1, and R=0, in which Q is an input signal and has a value of 0 or 1;
5) facilitating logic operation of $\overline{P}$ by applying high level and low level so that D=P, E=1, W=1, and R=0;
6) facilitating logic operation of $\overline{Q}$ by applying high level and low level so that D=1, E=Q, W=0, and R=1;
7) facilitating logic operation of P+$\overline{Q}$ by applying high level and low level so that D=P, E=Q, W=1, and R=1;
8) facilitating logic operation of $\overline{P}$+Q by applying high level and low level so that D=P, E=Q, W=0, and R=0;
9) facilitating logic operation of $\overline{P} \cdot Q$ by applying high level and low level so that D=P, E=Q, W=1, and R=0;
10) facilitating logic operation of P·$\overline{Q}$ by applying high level and low level so that D=P, E=Q, W=0, and R=1;
11) facilitating logic operation of P·Q by applying high level and low level so that D=P, E=Q, W=1, and R=Q;
12) facilitating logic operation of $\overline{P} \cdot \overline{Q}$ by applying high level and low level so that D=P, E=Q, W=0, and R=Q;
13) facilitating logic operation of P+Q by applying high level and low level so that D=P, E=Q, W=1, and R=P;
14) facilitating logic operation of $\overline{P}+\overline{Q}$ by applying high level and low level so that D=P, E=Q, W=0, and R=P;
15) facilitating logic operation of $\overline{P} \cdot Q + P \cdot \overline{Q}$ by applying high level and low level so that D=0, E=P, W=1, and R=Q; and
16) facilitating logic operation of $P \cdot Q + \overline{P} \cdot \overline{Q}$ by applying high level and low level so that D=P, E=0, W=0, and R=Q; where P and Q represent two operation signals in two input Boolean logics.

13. A non-volatile Boolean logic operation circuit, comprising:
a) a fifth resistive switching element, said fifth resistive switching element comprising a positive electrode and a negative electrode;
b) a sixth resistive switching element, said sixth resistive switching element comprising a positive electrode and a negative electrode;
c) a first resistor;
d) a first switching element, said first switching element comprising a first end and a second end; and
e) a first voltage converter, said first voltage converter comprising a first end and a second end;
wherein:
said negative electrode of said fifth resistive switching element operates as a first input end of said logic operation circuit and is adapted to receive a first input signal;
said negative electrode of said sixth resistive switching element operates as a second input end of said logic operation circuit and is adapted to receive a second input signal;
said positive electrode of said sixth resistive switching element is connected to said positive electrode of said fifth resistive switching element, and further to said first end of said first switching element, and said second end of said first switching element is connected to the ground via said first resistor; and
said first end of said first voltage converter is connected to said second end of said first switching element, and said second end of said first voltage converter operates as an output end of said logic operation circuit and is adapted to output a logic operation result of the first input signal and the second input signal.

14. The circuit of claim 13, wherein
in operation, forward writing of an initial state W=1 is facilitated by applying high level to said first input end, and low level to said second input end, and reverse writing of said initial state $\overline{W}$=1 is facilitated by applying low level to said first input end, and high level to said second input end;
resistive switching of said fifth resistive switching element and said sixth resistive switching element is facilitated by inputting a signal A to said first input end, and a signal B to said second input end according to an initial state of each of said resistive switching elements, and results of said input signals A and B after logic operation are stored according to said resistive switching;
outputting of a storage state of said fifth resistive switching element is facilitated by inputting a read voltage to said first input end and suspending said second input end, and outputting of a storage state of said sixth resistive switching element is facilitated by inputting said read voltage to said second input end and suspending said first input end; and
said input signal A or said input signal B is a high-level signal or a low-level signal, and an amplitude of said read voltage is less than that of a voltage of each of said resistive switching elements as resistive switching occurs, namely a threshold voltage thereof.

15. The circuit of claim 14, wherein said fifth resistive switching element and said sixth resistive switching element are memristors.

16. The circuit of claim 15, wherein a threshold value of said first voltage converter ranges from R/(R+RL)Vr to R/(R+Rh)Vr, where R represents a resistance of said first resistor, RL represents a resistance of each of said resistive switching elements in a low resistance state, Rh represents a resistance of each of said resistive switching elements in a high resistance state, and Vr represents a magnitude of said read voltage.

17. The circuit of claim 13, wherein said fifth resistive switching element and said sixth resistive switching element are memristors.

18. The circuit of claim 17, wherein a threshold value of said first voltage converter ranges from R/(R+RL)Vr to R/(R+Rh)Vr, where R represents a resistance of said first resistor, RL represents a resistance of each of said resistive switching elements in a low resistance state, Rh represents a resistance of each of said resistive switching elements in a high resistance state, and Vr represents a magnitude of said read voltage.

19. The circuit of claim 18, wherein
said first switching element is a first voltage control switch;
said first voltage converter comprises a second voltage control switch and a third voltage control switch;
said first voltage control switch is a switching element that is switched on in high level and switched off in low level, said second voltage control switch is a switching element that is switched on in high level and switched off in low level, and said third voltage control switch is a switching element that is switched on in low level and switched off in high level.

20. The circuit of claim 19, wherein said first voltage control switch and said second voltage control switch are N-type field effect transistors, and said third voltage control switch is a P-type field effect transistor.

* * * * *